(12) United States Patent
Shelnutt et al.

(10) Patent No.: US 9,020,656 B2
(45) Date of Patent: Apr. 28, 2015

(54) INFORMATION HANDLING SYSTEM THERMAL CONTROL BY ENERGY CONSERVATION

(75) Inventors: Austin Shelnutt, Pflugerville, TX (US); German Florez-Larrahondo, Georgetown, TX (US); Sharadha Parthasarathy, Austin, TX (US); Tyler Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 525 days.

(21) Appl. No.: 13/431,007

(22) Filed: Mar. 27, 2012

(65) Prior Publication Data

US 2013/0258582 A1  Oct. 3, 2013

(51) Int. Cl.
  *G06F 1/20* (2006.01)
  *G05D 23/19* (2006.01)

(52) U.S. Cl.
  CPC ............ *G06F 1/206* (2013.01); *G05D 23/1927* (2013.01)

(58) Field of Classification Search
  CPC ........... G06F 1/206; G06F 1/20; G06F 1/203; G05D 23/19; G05D 23/1902; G05D 23/1927
  USPC .................. 700/291, 295, 297, 300
  See application file for complete search history.

(56) References Cited

U.S. PATENT DOCUMENTS

| | | | |
|---|---|---|---|
| 4,722,669 A | 2/1988 | Kundert | |
| 5,101,040 A | 3/1992 | Cohen | |
| 5,102,040 A | 4/1992 | Harvey | |
| 6,868,652 B2 | 3/2005 | Arends et al. | |
| 7,130,719 B2 | 10/2006 | Ehlers et al. | |
| 7,424,343 B2 | 9/2008 | Kates | |
| 2004/0133314 A1 | 7/2004 | Ehlers et al. | |
| 2005/0216221 A1* | 9/2005 | Broyles et al. | 702/132 |
| 2006/0214014 A1 | 9/2006 | Bash et al. | |
| 2009/0099696 A1 | 4/2009 | Artman et al. | |
| 2009/0167228 A1* | 7/2009 | Chung et al. | 318/455 |
| 2009/0265568 A1 | 10/2009 | Jackson | |
| 2009/0296342 A1* | 12/2009 | Matteson et al. | 361/679.46 |
| 2010/0179695 A1 | 7/2010 | Collins et al. | |
| 2010/0194321 A1* | 8/2010 | Artman et al. | 318/454 |
| 2011/0077796 A1* | 3/2011 | Aklilu et al. | 700/300 |
| 2011/0224837 A1 | 9/2011 | Moss et al. | |
| 2012/0329377 A1* | 12/2012 | Wu | 454/184 |
| 2013/0332757 A1* | 12/2013 | Moss et al. | 713/320 |

* cited by examiner

*Primary Examiner* — Mohammad Ali
*Assistant Examiner* — Nathan Laughlin
(74) *Attorney, Agent, or Firm* — Terrile, Cannatti, Chambers & Holland, LLP; Robert W. Holland

(57) ABSTRACT

A thermal state within an information handling system enclosure is managed within predetermined constraints by estimating thermal energy introduced to the enclosure by power dissipation to electronic components and thermal energy removed from the enclosure by a cooling airflow generated by a fan. A desired bulk temperature of a cooling airflow is attained at a predetermined position in an enclosure by selecting a fan speed and power allocation to the components that conserves energy within the enclosure at a predetermined thermal state.

19 Claims, 3 Drawing Sheets

INFORMATION HANDLING SYSTEM THERMAL CONTROL BY ENERGY CONSERVATION

BACKGROUND OF THE INVENTION

1. Field of the Invention

The present invention relates in general to the field of information handling system thermal control, and more particularly to information handling system thermal control by energy conservation.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are typically built by assembling a variety of components into a chassis so that the components cooperate to process information. For example, a blade server information handling system has a chassis that accepts plural blade server modules by sharing power and networking resources of the chassis with the blade servers under the control of a chassis management controller (CMC). Each blade server module typically has a motherboard with one or more central processing units (CPUs), power distribution circuits, persistent storage devices like hard disk drives or solid state drives, memory like DRAM, networking components, mezzanine cards and a baseboard management controller (BMC) that provides management functions like remote power-up and power-down. The chassis management controller manages power resources by distributing power allocations to the blade modules. A baseboard management controller on each blade module powers components within the blade module to operate within the power allocation budget provided by the chassis management controller. The chassis management controller also typically manages cooling resources provided by a fan controller and one or more cooling fans based upon thermal information provided from the baseboard management controllers, such as thermal measurements at components within each blade module. In server information handling systems, a bulk air temperature represented by the temperature of a cooling airflow exhaust is sometimes managed by adjusting fan speed to maintain less than a maximum exhaust temperature.

One difficulty with management of thermal conditions in an information handling system chassis is that thermal conditions tend to vary throughout a chassis enclosure. Variance in thermal conditions can be significant in a modular information handling system, such as a blade information handling system, where a particular module has a higher workload than other modules in the same chassis. Variance in thermal conditions can also be significant across an information handling system module where different components of the module operate at varying workloads. For example, thermal conditions near a central processing unit typically increase during the performance of processing-intensive operations. In order to monitor thermal conditions at processors, processors typically incorporate a thermal sensor, such as a thermistor, and logic to report thermal conditions measured by the thermal sensor to a system thermal manager, such as firmware instructions running on a BIOS, BMC, CMC, and/or fan controller that manages cooling fan operating speeds. Processors are typically physically located "upstream" of a cooling airflow provided by a cooling fan to provide efficient cooling since processors generally are one of the greatest sources of thermal energy in a chassis and also usually among the most heat sensitive of components. Other components are typically disposed in the chassis "downstream" of the processor so that cooling airflow passes by the processor first and then passes by less-heat sensitive components.

One difficulty with managing thermal conditions in an information handling system chassis enclosure is that not all components integrate thermal self-protection capabilities in order to maintain reliability conformance during thermal excursions, such as when a cooling system fails, extreme ambient environmental temperatures exist or ultra-high stress operating conditions exist that exceed the capabilities of a chassis' cooling system. For example, a processor operating in extreme thermal conditions will throttle its power consumption to reduce heat generation and maintain its internal temperature within a desired constraint; however, mezzanine cards, some hard disk drives and many on board devices like networking, chipset, power distribution and BMC devices, do not include thermal sensors or thermal self-protection capabilities. Since these thermally "helpless" components are often downstream of a cooling airflow, the three primary ways of ensuring adequate cooling of "helpless" components are to throttle the helpless components, to increase fan speeds so that a greater cooling airflow exists to remove excess thermal energy or to throttle upstream components so that less thermal energy is generated to reduce the downstream cooling airflow temperature. Unfortunately, if components do not have thermal sensors then no direct measurement of thermal conditions at the components exists to provide direct control over thermal conditions at the component.

In order to manage thermal conditions within an information handling system chassis for components that do not include thermal sensors, some information handling systems dispose thermal sensors near components that monitor localized air temperatures. Unfortunately, as air flows through an information handling system enclosure, air streamlines across the enclosure can have significant variation in temperature even across small linear separations. In chassis enclosures that include plural modules, such as a blade chassis, an exhaust temperature of a cooling subsystem that cools plural modules does not necessarily indicate thermal conditions at any one module because different modules often run different loads. For example, a module running at a high load can have extreme thermal conditions even though the bulk temperature of a cooling subsystem exhaust is in a normal range. One solution for thermal management of components that lack thermal sensors is to nest a large array of onboard thermistors to average thermal readings for a more accurate "bulk" air temperature. This solution tends to increase system cost by the addition of plural interfaced sensors and system complexity by having multiple thermal measurements and multiple failure points.

SUMMARY OF THE INVENTION

Therefore a need has arisen for a system and method which measures information handling system thermal conditions to manage cooling system operation and component throttling for managing thermal conditions of components that lack thermal monitoring.

In accordance with the present invention, a system and method are provided which substantially reduce the disadvantages and problems associated with previous methods and systems for managing cooling system operation and component throttling to manage thermal conditions of components that lack thermal monitoring. A thermal state at a predetermined location within a chassis enclosure is managed by applying power dissipation of electronic components and inlet temperature of a cooling airflow to set a fan speed that establishes a desired cooling airflow rate.

More specifically, an information handling system has plural components disposed in an enclosure that cooperate to process information. A cooling fan provides a cooling airflow from an inlet, past the components and out an outlet. The components are powered by a power supply under the direction of a power manager, which monitors power dissipated by the components. A thermal manager interfaced with the power manager and the cooling fan establishes a cooling fan speed to maintain a predetermined thermal state within the enclosure by applying power dissipation of a set of components and a temperature sensed at the cooling fan inlet. For example, in a modular information handling system having plural processing modules, such as a blade server having plural blades, the thermal manager manages the thermal state associated with a processing module by applying the power dissipated by the components of the processing module and the inlet temperature for cooling airflow to determine a cooling fan speed that will provide a sufficient cooling airflow to maintain less than a predetermined bulk temperature with the processing module. If the cooling fan cannot provide an adequate cooling airflow, then the thermal manager reduces power consumption of one or more components to maintain the desired thermal state in the processing module. For instance, the thermal module throttles a processor even though the temperature sensed at the processor is in a normal operating range so that downstream components will have adequate cooling, even though the downstream components do not have direct temperature sensing. The adequate cooling of the downstream components is ensured by cooled airflow.

The present invention provides a number of important technical advantages. One example of an important technical advantage is that thermal conditions within an information handling system enclosure are accurately measured without having to dispose an array of sensors throughout the enclosure. Measurements of enclosure thermal conditions estimated by the Law of Conservation of Energy are applied to provide thermal control for downstream components that lack thermal sensors. If thermal conditions within the enclosure exceed a threshold associated with operation of unmonitored components, the thermal conditions are managed to maintain an operating environment acceptable to the unmonitored components. For example, upstream components are throttled to reduce thermal energy released to a cooling airflow, fan speed is increased to reduce cooling airflow temperature or unmonitored components are throttled or powered down to reduce downstream thermal energy release or prevent damage to the unmonitored components. Bulk enclosure thermal energy estimates derived from the Law of Conservation of Energy combined with thermal measurements from monitored components offers a more precise overall picture of thermal operating conditions at an information handling system without unnecessary thermal sensors and system complexity.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A thermal state within an information handling system enclosure is managed by adjusting fan speed for a cooling airflow in the enclosure based upon an inlet temperature of the cooling airflow and power dissipated to components running within the enclosure. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
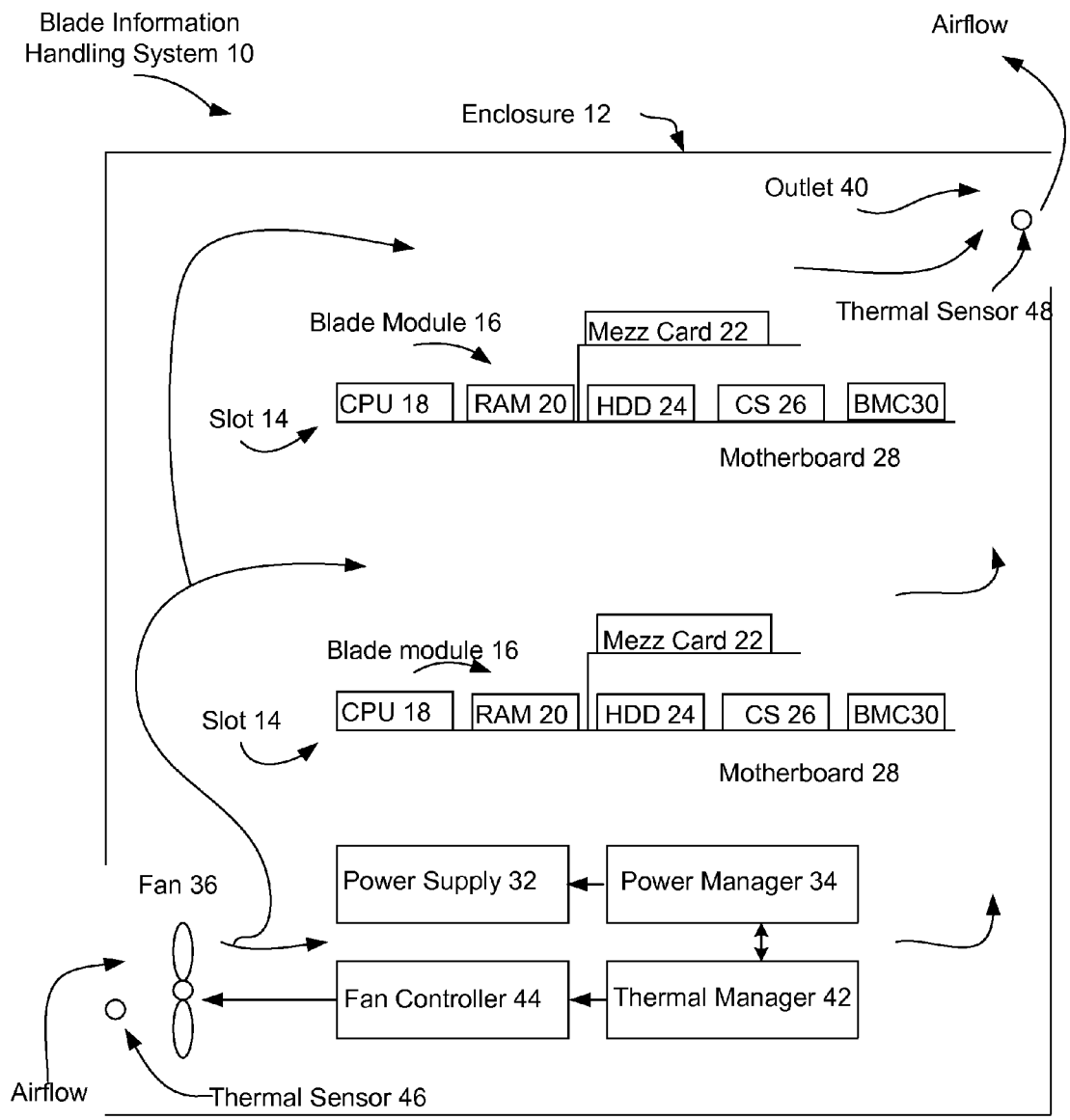
FIG. 1 depicts a side view of an example of an information handling system that manages a thermal state in an enclosure by adjusting fan speed based on power dissipation and cooling airflow inlet temperature.

Referring now to FIG. 1, a side view depicts an example embodiment of an information handling system 10 that manages a thermal state in an enclosure 12 by adjusting fan speed based on power dissipation and cooling airflow inlet temperature. In the example embodiment, information handling system 10 is a blade server having plural slots 14, each slot 14 accepting a blade information handling system module 16 that processes information. For example, each blade information handling system module 16 includes components that cooperate to process information, such as a CPU 18, RAM 20, a mezzanine card 22, a hard disk drive 24, and a chipset 26 that communicate through a motherboard 28. The components are managed by a baseboard management controller (BMC) 30, which selectively provides power to the components from a power supply 32 by communicating with a power manager 34.

During operation of components disposed in enclosure 12, thermal energy is generated in varying amounts based upon the power consumption of the components. For example, under a heavy processing load, CPU 18 uses increased power and produces increased thermal energy as a byproduct of processing information. Some components, such as CPU 18, include a temperature sensor that senses the temperature of the components during operations. Other components do not include a sensor that allows a direct indication of the component's temperature, such as some hard disk drives and mezzanine cards as well as basic electronic components disposed in motherboard 28, like resistors and capacitors. In varying degrees, the components have power consumption managed by logic running in chipset 26 and/or on BMC 30. For example, BMC 30 manages power consumption of CPU 18 by selectively throttling the speed at which CPU 18 executes instructions to reduce power consumption. As another example, firmware in chipset 26 under the direction of BMC 30 removes power from mezzanine card 22 and hard disk drive 24 to reduce power consumption and the associated generation of thermal energy.

One or more cooling fans 36 disposed in enclosure 12 draws a cooling airflow through an inlet 38 and passes the cooling airflow over the components and out an outlet 40 to remove excess thermal energy from the components. In order to ensure proper operation of components within enclosure 12, the thermal state within enclosure 12 is managed to stay within defined constraints, such as a maximum bulk air temperature. In the example depicted by FIG. 1, CPU 18 is located upstream in the cooling airflow, meaning closer to inlet 38, since CPU 18 tends to create more excess thermal energy than other components and typically needs a cooler temperature of the cooling airflow to obtain adequate cooling. Other components are located downstream of CPU 18, meaning closer to outlet 40, since these components tend to produce less excess thermal energy. Downstream components obtain adequate cooling as long as the increase in cooling airflow temperatures from upstream components is not excessive; however, since some downstream components often do not have direct temperature monitoring, such as by a temperature sensor disposed in the component, inadequate cooling airflow and/or excessive thermal energy production by upstream components can result in an overtemperature at downstream components.

In order to prevent an overtemperature of downstream components, a thermal manager 42 manages the speed selected for cooling fan 36 by communicating a cooling fan speed to fan controller 44, which sets the speed at which cooling fan 36 runs. Selection of an increased cooling fan speed results in a greater airflow, typically measured in cubic feet per minute (CFM), to provide increased thermal transfer of thermal energy from components to the airflow and out outlet 40. Thermal manager 42 selects a cooling fan speed that will maintain a predetermined thermal state within enclosure 12, such as a bulk air temperature in the proximity of a selected set of components. The predetermined thermal state is defined to provide operating conditions within the thermal constraints of the components disposed within enclosure 12. For example, the predetermined thermal state is associated with a bulk airflow temperature that is quantifiable by the temperature at outlet 40 or a temperature measured at various physical locations within enclosure 12, such as in a slot 14 or the space over a blade module.

Thermal manager 42 sets fan 36 speed to maintain a predetermined thermal state within enclosure 12 by applying the Law of Conservation of Energy to enclosure 12. In summary, at a predetermined energy state, energy entered into the enclosure by dissipation of power at the components equals energy removed from the enclosure by absorption to the cooling airflow provided by fan 36. Heating of a fluid in motion is defined as:

$$q=(m\text{dot})(Cp)(dT)$$

where q is the total energy dissipation, mdot is the mass flow rate of the energy absorbing fluid, Cp is the specific heat of the fluid, and dT represents the temperature rise of the fluid as a consequence of thermal energy input. In a typical information handling system operating condition, the density and specific heat of the cooling fluid, typically air but sometimes liquid, are constant. Assuming constant density and specific heat of air as a cooling fluid reduces the equation for conservation of energy in enclosure 12 to $$q=Q*K*dT$$

where Q is the volumetric flow rate of the cooling fluid, such as air stated in cubic feet per minute (CFM), and K is a constant that combines specific heat and density of fluid for the units chosen for the surrounding variables.

Thermal manager 42 maintains a predetermined thermal state in enclosure 12 by apply an inlet temperature measured by an inlet temperature sensor 46 and instantaneous power dissipation provided by power manager 44 to a characteristic airflow equation defined for enclosure 12 to determine a fan speed setting for fan 36. For example, a characteristic airflow equation soft or hard coded into thermal manager 42 yields a duty cycle for fan 36:

$$\% \text{ Duty Cycle}=A1(\text{CFM Request})+B1$$

where A1 and B1 are configuration constants describing the relationship of a given chassis between airflow in CFM and fan duty cycle speed settings. A characteristic airflow equation may be defined for any particular portion of an enclosure where a thermal state may be of interest, such as within a blade module or over a downstream portion of a processing module that lacks direct monitoring of component temperatures.

If the cooling fan speed setting for a given CFM request is greater than 100%, then the cooling fan cannot provide the necessary cooling airflow to maintain a predetermined thermal state in enclosure 12 for the current power dissipation. If available cooling fan speed settings are not sufficient to maintain the predetermined thermal state, then thermal manager 42 commands a reduction in power consumption by one or more of the components disposed in enclosure 12. Thus, even though temperatures measured at monitored components are within limits, such as a temperature measured at a CPU 18, thermal manager 42 can throttle CPU 18 to reduce the thermal state within enclosure 12 and prevent overheating of components downstream of CPU 18. Alternatively, thermal manger 42 can power down downstream components that lack direct monitoring of their thermal state to reduce power dissipation and thereby reduce the thermal state within enclosure 12. In one embodiment, thermal manager 42 selects components to have a reduced power consumption based upon an amount of power dissipation reduction that will provide a thermal state within constraints given available cooling fan speed settings. For example, if a reduction of power dissipation by 10 Watts will provide the predetermined thermal state with a fan duty cycle of 100%, then thermal manager can select throttling of CPU 18 or power down of mezzanine card 22 so that power dissipation is reduced by 10 Watts. In one embodiment, thermal manager 42 selects components to have a reduced power dissipation based upon functions being performed by information handling system 10. As an example, if current operations do not require a video card disposed on a mezzanine card 22, then thermal manager 42 directs BMC 30 and/or chipset 26 to power down mezzanine card 22 so that throttling of CPU 18 is avoided.

In one embodiment, thermal manager 42 manages the thermal state at plural points in enclosure 12. For example, each of plural blade modules 16 is allocated power by power manager 34 to ensure that the limits of power supply 32 are not exceeded. Power manager 34 monitors power dissipation at each blade module 16 and reports the power dissipation for each blade module 16 to thermal manager 42. Thermal manager 42 applies the power dissipation at a blade module 16 to determine the thermal state of the blade module 16 so that each blade module 16 has its thermal state individually monitored. Thermal manager 42 manages the thermal state within each blade module 16 by managing power dissipation of components of the blade module 16 based upon a characteristic airflow equation for the blade module. Thus, for example, even though enclosure 12 overall has a thermal state within predetermined constraints, an individual blade module 16 within enclosure 12 having a high workload may experience an overtemperature due to power dissipation of components at the blade module 16. Thermal manager 42 addresses local thermal states within enclosure 12 based upon local power dissipation and local airflow characteristics to prevent local overtemperatures by throttling or powering down selected components within the local thermal state or upstream of the local thermal state. In one alternative embodiment, thermal sensors may be disposed at various locations in enclosure 12, such as an exhaust sensor 48 or sensors within a blade module 16, for a comparison of measured bulk temperatures with expected bulk temperatures; however, an advantage of the present disclosure is that management of a thermal state within enclosure 12 is performed without requiring temperature sensors that attempt to measure bulk air temperature after heating by components.

Figure 2:
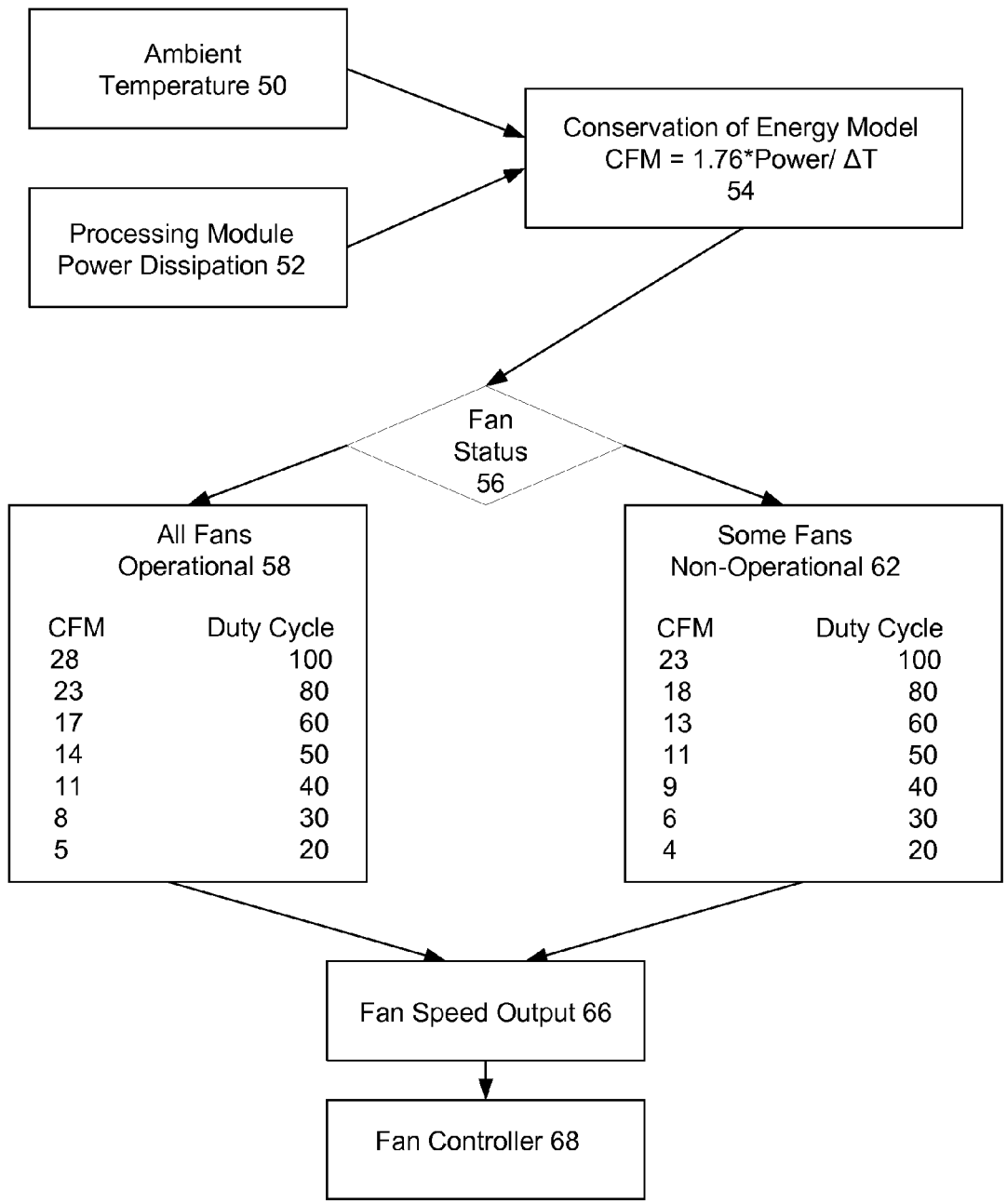
FIG. 2 depicts a functional block diagram of a process for managing an information handling system enclosure thermal state by adjusting fan speed based on power.

Referring now to FIG. 2, a functional block diagram of a process for managing an information handling system enclosure thermal state by adjusting fan speed based on power. At step 50, ambient air temperature is sensed at the inlet for a cooling airflow. At step 52, power dissipation by components of an information handling system is sensed. At step 54, ambient temperature and power dissipation are applied to a model of the information handling system to determine a thermal state. The model can apply to a complete enclosure such as to estimate bulk air temperature at an exhaust of the enclosure or to a portion of an enclosure, such as to estimate the bulk air temperature proximate a processing module, such as a server sled or blade. The thermal state that results from step 54 is applied to a cooling fan state at step 56 to determine a fan speed that will provide a cooling airflow for a desired thermal state of the bulk temperature modeled at step 54. For example, if all cooling fans are operational, values presented in table 60 are applied for determining air flow from a fan duty cycle. If one or more of plural fans have failed, values presented in table 62 are applied for determining air flow from a fan duty cycle. In an alternative embodiment, air flow rates are determined as part of a characteristic airflow equation as described above. At step 66, the fan duty cycle is provided that will maintain a desired thermal state for the enclosure or portion of the enclosure modeled at step 54. At step 68, the fan controller sets the fan speed at the determined duty cycle to control the air flow so that a desired thermal state results.

Figure 3:
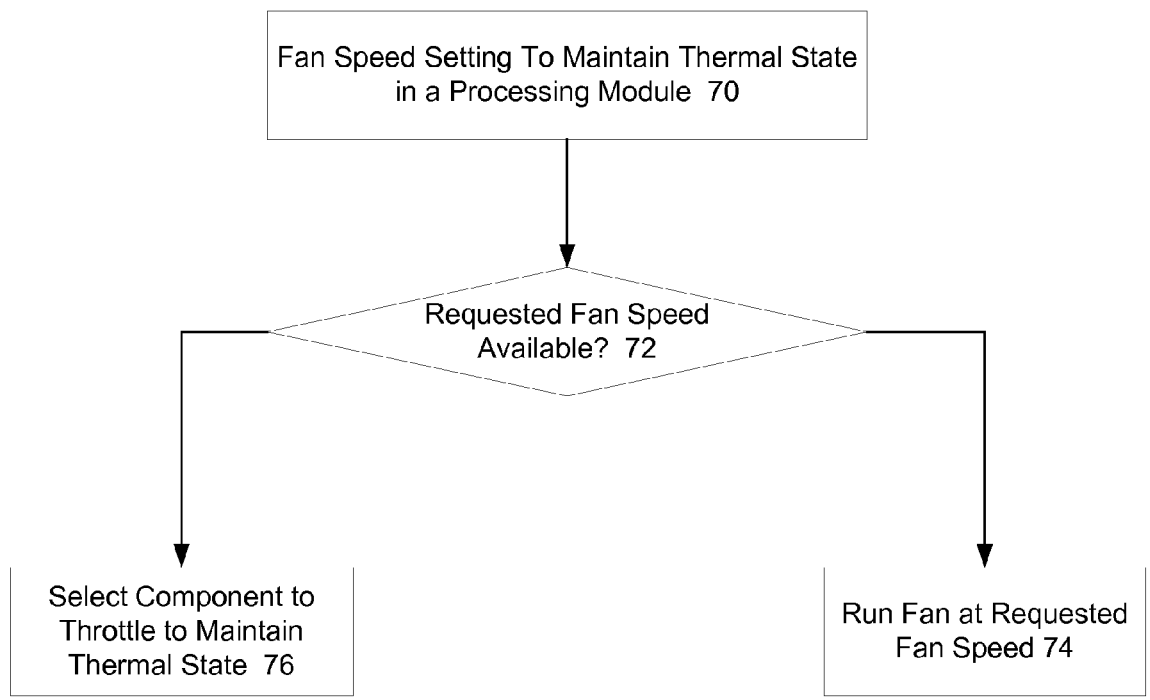
FIG. 3 depicts a flow diagram of a process for managing an information handling system enclosure thermal state by adjusting fan speed and power dissipation.

Referring now to FIG. 3, a flow diagram depicts a process for managing an information handling system enclosure thermal state by adjusting fan speed and power dissipation. The process begins at step 70 with a fan speed setting output for maintaining a desired thermal state. At step 72, a determination is made of whether the cooling fan can operate at the fan speed needed to maintain the desired thermal state. If the requested fan speed is available, the process continues to step 74 to set the fan speed. If at step 72 the requested fan speed exceeds an available fan speed, the process continues to step 76 to reduce power consumption at one or more components so that the fan speeded needed to maintain the desired thermal state does not exceed the available fan speed.

Although the present invention has been described in detail, it should be understood that various changes, substitutions and alterations can be made hereto without departing from the spirit and scope of the invention as defined by the appended claims.

What is claimed is:

1. An information handling system comprising:
an enclosure having an inlet and an outlet;
plural components disposed in the enclosure and operable to cooperate to process information;
a cooling fan disposed in the enclosure and operable to generate a cooling airflow from the inlet to the outlet with a selected of plural available fan speeds;
a power supply operable to power the plural components;
an inlet temperature sensor operable to sense airflow temperature at the inlet; and
a thermal manager interfaced with the cooling fan, power supply and inlet temperature sensor, the thermal manager operable to apply power dissipated by the power supply to one or more of the components and the inlet airflow temperature to set a speed of the cooling fan that maintains a predetermined thermal state in the enclosure proximate the one or more of the components, the thermal manager further operable to determine that the plural available fan speeds will not maintain the predetermined thermal state and, in response, to select one or more components of the one or more components to power down to allow available fan speeds to maintain the predetermined thermal state, the selected component having a predetermined thermal profile.

2. The information handling system of claim 1 wherein the thermal manager is further operable to reduce power consumption by one or more of the plural components if the cooling fan set on full speed fails to establish the predetermined thermal state.

3. The information handling system of claim 2 wherein the thermal manager reduces power consumption by powering down one or more unmonitored components of the plural components, the one or more unmonitored components lacking a thermal sensor.

4. The information handling system of claim 3 wherein the one or more of unmonitored components comprises a mezzanine card.

5. The information handling system of claim 2 wherein the thermal manager reduces power consumption by throttling a monitored component of the plural components, the monitored component having a thermal sensor that provides a temperature associated with the monitored component to the thermal manager.

6. The information handling system of claim 5 wherein the thermal manager is further operable to apply the temperature associated with the monitored component to determine a throttled state for the monitored component that will maintain the predetermined thermal state in the enclosure.

7. The information handling system of claim 1 wherein the thermal manager comprises a relationship between the cooling fan speed and an airflow rate through the enclosure.

8. The information handling system of claim 1 wherein the enclosure comprises a chassis having plural slots, each slot operable to accept a processing module, the thermal manager applying power dissipated by the power supply for each processing module to maintain a predetermined thermal state for each processing module.

9. The information handling system of claim 8 wherein the information handling system comprises a blade server and the processing modules comprise blade modules.

10. A method for managing a thermal state in an information handling system enclosure, the method comprising:
powering components in the enclosure to process information;
flowing air with a fan from an inlet over the components to an outlet;
sensing the temperature of the air at the inlet;
sensing power dissipated by the powering components in the enclosure;
applying the inlet temperature and the power dissipated to determine a speed for the fan that maintains a predetermined thermal state at a predetermined position within the enclosure;
determining that available fan speeds will not maintain the predetermined thermal state; and
in response to determining, selecting one or more components of the components to power down to allow available fan speeds to maintain the predetermined thermal state, the selected component having a predetermined thermal profile.

11. The method of claim 10 further comprising
determining that a highest available fan speed is inadequate to maintain the predetermined thermal state; and
in response to determining, reducing power consumption of one or more of the components to maintain the predetermined thermal state.

12. The method of claim 11 wherein the applying the inlet temperature and power dissipated to determine a speed for the fan further comprises determining an airflow rate for the enclosure and fan that absorbs thermal energy produced by the components, wherein the thermal energy produced by the components relates in a predetermined manner with the power dissipation.

13. The method of claim 10 further comprising:
sensing the temperature of the air at the outlet; and
comparing the temperature of the air at the outlet with an expected temperature of the predetermined thermal state.

14. The method of claim 10 further comprising:
sensing the temperature of at least one component;
determining that a highest available fan speed is inadequate to maintain the predetermined thermal state; and
in response to determining, reducing power consumed by the at least one component.

15. The method of claim 14 wherein the at least one component comprises a processor.

16. The method of claim 15 wherein reducing power consumed by the processor further comprises reducing power consumed to reduce the temperature sensed at the processor to a predetermined temperature.

17. A system for managing a thermal state in an information handling system enclosure, the system comprising:
a fan operable to provide a cooling airflow at plural selectable speeds;
a temperature sensor operable to sense air temperature at an inlet of the information handling system enclosure;
a power manager operable to determine power provided to run electronic components disposed within the information handling system enclosure, the electronic components operable to cooperate to process information; and
a thermal manager interfaced with the fan, the temperature sensor and the power manager, the thermal manager operable to apply the sensed inlet air temperature and the determined power for a set of less than all of the components to select a fan speed to manage the thermal state in the information handling system enclosure associated with the set of less than all of the components within predetermined constraints;
wherein the thermal manager is further operable to determine that none of the plural selectable fan speeds will maintain the predetermined constraints and, in response, to select one or more components of the components to power down to allow a selected of the plural selectable fan speeds to maintain the predetermined constraints, the selected component having a predetermined thermal profile.

18. The system of claim 17 wherein the thermal manager is further operable to power down one or more of the components to manage the thermal state in the information handling system enclosure.

19. The system of claim 17 wherein the power manager is further operable to determine power provided to run components in each of plural modules and the thermal manager is further operable to apply the determined power in each of the plural modules to manage the thermal state in each of the plural modules.

* * * * *